(12) United States Patent
Wendel et al.

(10) Patent No.: US 6,532,483 B1
(45) Date of Patent: Mar. 11, 2003

(54) FILTER FOR TIME DIVISION MULTIPLEX FILTERING OF A PLURALITY OF DATA TRAINS, AND OPERATING METHODS THEREFOR

(75) Inventors: Dirk Wendel, Unterhaching (DE); Sönke Mehrgardt, Deisenhofen (DE); Xiaoning Nie, Vaterstetten (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/536,169

(22) Filed: Mar. 27, 2000

Related U.S. Application Data (63) Continuation of application No. PCT/DE98/02651, filed on Sep. 8, 1998.

(30) Foreign Application Priority Data

Sep. 26, 1997 (DE) ............................................. 197 42 599

(51) Int. Cl.⁷ ............................................. G06F 17/10
(52) U.S. Cl. ..................................... 708/316; 708/319
(58) Field of Search ................................. 708/300, 301, 708/316, 319

(56) References Cited

U.S. PATENT DOCUMENTS 4,893,265 A    1/1990   Hirosaki

FOREIGN PATENT DOCUMENTS

| DE | 43 39 718 A1 | 5/1995 |
|----|--------------|--------|
| EP | 0 137 464 A2 | 4/1985 |
| EP | 0 305 708 A2 | 3/1989 |

OTHER PUBLICATIONS

International Publication No. WO 97/09780 (Pelgrom et al.), dated Mar. 13, 1997.

Fliege: "Multiraten–Signalverarbeitung" [Multi–rate signal–processing], Teubner Verlag Stuttgart 1993, ISBN 3–519–06155–4, pp. 114 to 123.

*Primary Examiner*—Chuong Dinh Ngo
(74) *Attorney, Agent, or Firm*—Laurence A. Greenberg; Werner H. Stemer; Gregory L. Mayback (57) ABSTRACT

A filter for filtering n data trains by time division multiplexing includes data channels for receiving data train values, registers subdivided into n groups for buffer storage of the data train values or derived values, and adders each having inputs. Each of the n groups is connected to one of the data channels. The adders and the registers alternatively connect to form a chain. The first input of respective adders connected upstream of a respective register of an $i^{th}$ group ($0 \leq i \leq n-1$) has a connection to respective data channels assigned to the $i^{th}$ group, and the second input is connected to a respective register of a group having a number $(i-1) \bmod n$ without an intervening register of another group. The filter is used to parallelly decimate data trains by a common factor. A filter configuration includes the filter and two multipliers. A method is also provided.

14 Claims, 4 Drawing Sheets

FILTER FOR TIME DIVISION MULTIPLEX FILTERING OF A PLURALITY OF DATA TRAINS, AND OPERATING METHODS THEREFOR

CROSS-REFERENCE TO RELATED APPLICATION

This is a continuation of copending international application PCT/DE98/02651, filed Sep. 8, 1998, which designated the United States.

BACKGROUND OF THE INVENTION

FIELD OF THE INVENTION

The invention lies in the field of communications. The present invention relates to an apparatus and a method for filtering a plurality of data trains by time division multiplexing.

There are many applications in which two or more digital data streams or trains have to be filtered in the same way. In television technology, for instance, it may be necessary for data triplets, such as trains of RGB or YUV data to be decimated by the same factor.

In multiplex transmission of a plurality of data trains over a common channel, it can also become necessary to adapt the bandwidth of the data trains to the transmission bandwidth of the channel by low-pass filtering that is uniform for all the trains. The maximum frequency present in each data train must not be any higher than ½n times the scanning frequency or the transmission frequency of the channel. Otherwise, problems known as aliases occur.

To keep these problems as slight as possible, it is typical to low-pass filter the data trains individually before their transmission over the channel. After the filtration, a new train is formed from the plurality of data trains with the aid of a reversing switch; the new train is composed cyclically of values from the different starting trains and can be transmitted over the channel.

The low-pass filters used for such purpose have transfer functions of the following form, for example $$H(z^{-1}) = (1 - z^{-1})^m$$

and include a series circuit of register-adder units, in which the inputs of the adders are each connected once directly and once through a delay register to the input of the unit.

These conventional filters, because of their construction, determine one output value for each input value of an original train. It is possible that because of a limited transmission capacity of the transmission channel, only some of these values can be picked up; this means that the others were determined in vain.

SUMMARY OF THE INVENTION

It is accordingly an object of the invention to provide an apparatus and a method for filtering a plurality of data trains by time division multiplexing that overcomes the hereinafore-mentioned disadvantages of the heretofore-known devices and methods of this general type and that make it possible to reduce the expense for circuitry involved in reserving a separate filter for each original data train, and thus to minimize the substrate area required for integrating such filters.

With the foregoing and other objects in view, there is provided, in accordance with the invention, a filter for filtering n data trains by time division multiplexing, in which n is an integer>1, including data channels for receiving values of the n data trains, registers for buffer storage of at least one of the values of the n data trains and derived values derived from the n data trains, the registers subdivided into n groups, each of the n groups of the registers connected to at least one of the data channels for receiving the values of the n data trains, and adders each having a first input and a second input, the adders and the registers alternatively connected to one another to form a chain, the first input of each respective adder connected upstream of a respective one of the registers of an $i^{th}$ group ($0 \leq i \leq n-1$) of the n groups has a connection to a respective one of the data channels assigned to the $i^{th}$ group of the n groups, and the second input of a corresponding respective adder connected to a respective one of the registers of a group having a number (i−1)mod n without an intervening register of another of the groups.

The structure of the filter makes it possible to process a plurality of data trains simultaneously in one and the same filter, and, at every instant, the registers of one group contain only values that are derived from the values of a single one of the original trains.

Each time the registers of the filter are activated in order to store the values applied to their input, these values move onward only to the next group, without being affected by the values of other trains.

In accordance with another feature of the invention, there is provided a multiplier disposed between each of the n groups and at least one of the data channels.

In accordance with a further feature of the invention, there are provided parallel multipliers for multiplication by various factors, the parallel multipliers disposed between each of the n groups and at least one of the data channels, and a switch for selectively connecting one of the multipliers with a respective one of the adders.

In accordance with an added feature of the invention, there is provided at least one multiplier for multiplication by a factor k not a power of two, the at least one multiplier disposed between each of the n groups and at least one of the data channels and having parallel submultipliers for multiplying by a power of two ($2^j$), the parallel submultipliers having input data lines and output lines, the parallel submultipliers having a connection of the input data lines to the output lines each left-shifted by j bits, and further adders connected to the parallel submultipliers adding output values of the parallel submultipliers.

In accordance with an additional feature of the invention, the chain has m adders of the adders with an output and m registers of the registers with an input, an input of a $0^{th}$ register of the registers is connected to a respective data channel, and an input of a $j^{th}$ register is connected to an output of a $(j-1)^{th}$ adder for all j>0, the chain realizing a transfer function ($H(z^{-1}) = \Sigma a_j z^{-j}$) represented as a polynomial in $z^{-1}$ where j=0, 1, . . . , m−1.

The filter according to the invention with a polynomial transfer function $H(z^{-1}) = \Sigma a_j z^{-j}$ can be constructed as a series circuit of m register-adder units; the first input of the $0^{th}$ unit is connected to the associated signal channel, and the first inputs of all the other units are each connected to the output of the unit immediately preceding each of them.

In accordance with yet another feature of the invention, there is provided a multiplier, the m adders having an input, and the input of a $j^{th}$ adder of the m adders being connected to a respective data channel through the multiplier for multiplication by the factor $a_j$ for all $a_j \neq 1$.

A filter according to the invention is simple to construct by providing, for all factors $a_j \neq 1$ of the transfer function, one multiplier for multiplication by the factor $a_j$, which connects the second input of the $j^{th}$ unit to the assigned data channel.

Multipliers for multiplication by a power of two $2^j$ can be formed in a very simple way by a submultiplier that contains only a single data line, whose bit inputs are each linked with outputs whose value is higher by j bits.

Multipliers for multiplication by an arbitrary factor can be constructed from a plurality of submultipliers, in accordance with the powers of two contained in the factor, and adders for adding the outputs of the submultipliers.

In accordance with yet a further feature of the invention, at least one of the n groups has two registers of the registers each with an output, and at least one adder of the adders has two inputs respectively connected to the output of the two registers.

In accordance with yet an added feature of the invention, there is provided a switch, the registers each having an output, and the switch connecting an output of a register of a group $(i+1) \mod n (0 \leq i \leq n-1)$ of the registers selectively to at least one of the first input and the second input of respective adders connected upstream of respective registers of the registers of a group i of the n groups.

In accordance with yet an additional feature of the invention, there is provided a switch, the registers each having an output, and the switch connecting an input of a respective adder of the adders connected upstream of a register of a group $(i+1) \mod n (0 \leq i \leq n-1)$ of the n groups selectively to an output of respective registers of the registers of a group i of the n groups.

In accordance with again another feature of the invention, there is provided a multiplexer having n inputs for each of the n data trains and n outputs, each of the n outputs respectively connected to one of the data channels, the multiplexer outputting data values of one of the n data trains in cyclic alternation to the data channels.

Expediently, the filter also includes a multiplexer with n inputs for the n inputs and n outputs, to each of which one of the n signal channels is connected. The multiplexer is configured to output data values of one of the data trains in cyclic alternation to the various data channels.

In accordance with again a further feature of the invention, there is provided a demultiplexer having outputs, each of the outputs forming one output connected to a respective one of the n data trains of the filter, one of the adders having an output, and the demultiplexer connected to the output of the one of the adders.

For sorting out filtered values derived from various different data trains, a demultiplexer can be provided as an output stage of the filter optionally downstream of the transmission route. The demultiplexer is connected to the output of one of the units and has n outputs, each of the n outputs forms one output assigned to one of the data trains of the filter.

With the objects of the invention in view, there is also provided a filter configuration, including a filter for filtering two data trains by time division multiplexing having data channels for receiving values of the two data trains, registers for buffer storage of at least one of the values of the two data trains and derived values derived from the two data trains, the registers subdivided into n groups, each of the n groups of the registers connected to at least one of the data channels for receiving the values of the two data trains, and adders each having a first input and a second input, the adders and the registers alternatively connected to one another to form a chain, the first input of each respective adder connected upstream of a respective one of the registers of an $i^{th}$ group $(0 \leq i \leq n-1)$ of the n groups has a connection to a respective one of the data channels assigned to the $i^{th}$ group of the n groups, and the second input of a corresponding respective adder connected to a respective one of the registers of a group having the number $(i-1) \mod n$ without an intervening register of another of the groups, and two multipliers receiving values of a common original train, alternatively multiplying received values with sine factors and cosine factors, and outputting correspondingly multiplied values to the data channels to generate two quadrature modulated data trains from the original train.

With the objects of the invention in view, there is also provided a method for operating a filter for filtering n data trains by time division multiplexing, in which n is an integer>1, including receiving values of the n data trains through data channels, buffer storing at least one of values of the n data trains and derived values derived from the n data trains with registers and subdividing the registers into n groups, alternatively connecting adders and the registers to one another to form a chain, each of the adders having first and second inputs, connecting each of the n groups to at least one of the data channels, connecting a respective adder upstream of a respective one of the registers of an $i^{th}$ group $(0 \leq i \leq n-1)$ of the groups, and connecting the first input of each respective adder to a respective one of the data channels assigned to the $i^{th}$ group of the n groups, connecting the second input of a corresponding respective adder to a respective one of the registers of a group having a number $(i-1) \mod n$ without an intervening register of another of the n groups, applying a value of the $i^{th}$ data train to the data channel of the group $(i+d) \mod n$ for all $i=0, \ldots, n-1$, storing in each respective register the values present at the first inputs of each respective register, varying d in the applying step by 1, and repeating, at least once, the applying step, the storing step, and the varying step.

In accordance with again an added mode of the invention, the n data trains each have a clock rate, and setting clock rates of all of the n data trains to be the same.

In accordance with again an additional mode of the invention, the n data trains each have a clock period, and performing the applying step, the storing step, the varying step, and the repeating step n times during each clock period of the n data trains.

The output data rate of the filter can be selected largely freely in adaptation to the transmission capacity of the transmission channel. If the method steps are performed n times in each clock period of the original data trains, then for each input original data value, one filtered value is generated. If the steps are performed only once per clock period, this corresponds to a decimation of the original data by the factor n. In each case, regardless of the number of repetitions, however, with the filter of the invention no more data values than are actually output over the transmission channel are generated. Thus, the invention avoids the excess computation expense involved in conventional filters that decimate the data before the data is transmitted.

In accordance with still another mode of the invention, the n data trains each have a clock period, and performing the applying step, the storing step, the varying step, and the repeating step once during each clock period of the n data trains.

With the objects of the invention in view, there is also provided a method for operating a filter for filtering n data trains by time division multiplexing, in which n is an integer>1, including providing a filter having data channels for receiving values of the n data trains, registers for buffer storage of at least one of the values of the n data trains and derived values derived from the n data trains, the registers subdivided into n groups, each of the n groups connected to at least one of the data channels for receiving values of the n data trains, and adders each having first and second inputs, the adders and the registers alternatively connected to one another to form a chain, the first input of each respective adder connected upstream of a respective one of the registers of an $i^{th}$ group ($0 \leq i \leq n-1$) of the n groups has a connection to a respective one of the data channels assigned to the $i^{th}$ group of the n groups, and the second input of a corresponding respective adder connected to a respective one of the registers of a group having the number (i−1)mod n without an intervening register of another of the n groups, and parallelly decimating the n data trains by a common factor using the filter.

Other features that are considered as characteristic for the invention are set forth in the appended claims.

Although the invention is illustrated and described herein as embodied in a filter for time division multiplex filtering of a plurality of data trains, and operating methods therefor, it is nevertheless not intended to be limited to the details shown because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case.

Figure 11:
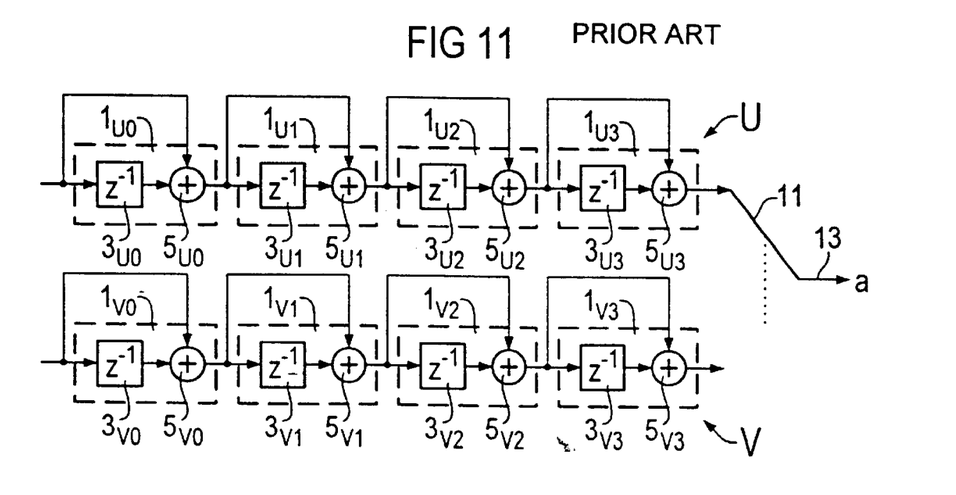
FIG. 11, is a conventional filter according to the prior art.

To make it easier to understand the mode of operation of the filter of the invention, the mode of operation of a conventional filter will first be discussed briefly in conjunction with FIG. 11. In FIG. 11, there is shown a conventional filter including two branches U and V, each with one input. The branches respectively receive an original data train $u_0$, $u_1$, ... and $v_0$, $v_1$, ... The filter has a reversing switch 11 that sends output values from the two branches in alternation onto a transmission channel 13. The transmission capacity of the channel 13 is equivalent to the clock rate of the two original data trains.

Each branch U, V includes a register-adder chain that includes a plurality of register-adder units $1_{U1}, 1_{U2}, \ldots$ and $1_{V1}, 1_{V2}, \ldots$ respectively. Each of the register-adder units include one register $3_{U1}, \ldots,$ or $3_{V1}, \ldots$ connected to a first input of the unit, for buffer storage of values of the data trains or values derived therefrom, and one adder $5_{U1}, \ldots,$ or $5_{V1}, \ldots,$ having an input connected to the output of the register $3_{U1}$ or $3_{V1}$, an input connected to a second input of the unit, and an output that forms an output of the unit. Both inputs of the units are connected to each other. Each unit has the transfer function $H^*(z^{-1})=z^{-1}+1$. Connecting these units m times in succession produces respective filter branches with the transfer function $H^*(z^{-1})=(z^{-1}+1)^m$. In the example shown in FIG. 11, m=4; the total transfer function of each branch is thus:

$$H(z^{-1})=(z^{-1}+1)^4=1+4z^{-1}+6z^{-2}+4z^{-3}+z^{-4}.$$

From original data trains $u=[u_1, u_2, u_3, u_4, u_5, u_6]$ and $v=[v_1, v_2, v_3, v_4, v_5, v_6]$, the two branches generate the following respective trains:

$u_1$
$u_2+4u_1$
$u_3+4u_2+6u_1$
$u_4+4u_3+6u_2+4u_1$
$u_5+4u_4+6u_3+4u_2+u_1$
$u_6+4u_5+6u_4+4u_3+u_2$
and
$v_1$
$v_2+4v_1$
$v_3+4v_2+6v_1$
$v_4+4v_3+6v_2+4v_1$
$v_5+4v_4+6v_3+4v_2+v_1$
$v_6+4v_5+6v_4+4v_3+v_2$.

These values are each both present simultaneously at the two inputs of the reversing switch 11. Because of the limited transmission capacity of the channel 13, not all the calculated values can be transmitted. A decimation of the data is done, in that the reversing switch 11 connects branch U and then branch V to the transmission channel 13 each in alternation during one clock period of the original data trains. Thus, at the input of the transmission channel 13, either the data train $u_1$
$v_2+4v_1$
$u_3+4u_2+6u_1$
$v_4+4v_3+6v_2+4v_1$
$u_5+4u_4+6u_3+4u_2+u_1$
$v_6+4v_5+6v_4+4v_3+v_2$, or its compliment is present, depending on the initial position of the reversing switch 11. That is, per clock period, two data values are generated, but only every other one .of them can be used.

Figure 1:
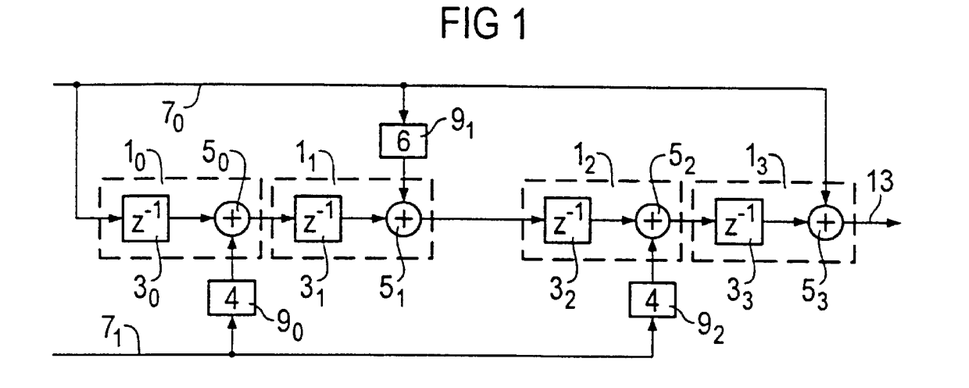
FIG. 1 is a schematic block circuit diagram of a first embodiment of a filter according to the invention.

FIG. 1 shows a first embodiment of a filter according to the invention. The transfer function of the filter is the same as for the filter of FIG. 11. Like that filter, it includes a chain with a plurality of register-adder units $1_0$, $1_1$, $1_2$, $1_3$, each with one register $3_0$, $3_1$, $3_2$ and $3_3$ and one adder $5_0$, $5_1$, $5_2$ and $5_3$, respectively. The units are subdivided into a $0^{th}$ group having the units $1_0$ and $1_2$ and a first group having the units $1_1$ and $1_3$. The register $3_0$ is directly connected to the data channel $7_0$ of the $0^{th}$ group. The adder $5_0$ is connected to the output of the register $3_0$ and, through a multiplier $9_0$, to the data channel $7_1$ of the first group. Thus, to the register of the following unit $1_1$, the adder $5_0$ outputs the sum of the contents of the register $3_0$, delayed by one clock period, and four times the value present at the data channel $7_1$ (the multiplication factor of 4 is shown in the multiplier). The succeeding units function analogously.

The filter of FIG. 1 is expediently preceded by a nonillustrated multiplexer with two inputs; each input receives the value of one of the two original data trains u, v to be filtered, and it outputs the received values to the $0^{th}$ and the first transmission channel in alternation. Consequently, in a clock period in which a value of the first train u is for instance present at the first data channel $7_1$, the registers $3_0$ and $3_2$ output data values to the adders $5_0$, $5_2$ that are derived from values of the train u, and vice versa. In the next clock period, the values derived from the train u are transferred to the registers of the $0^{th}$ group. Once again values of the different trains are not mixed together because in this clock period the value of the original train u is output by the multiplexer to the other data channel $7_0$.

It is clear that all the transfer functions of the form $$H(z)=a_0+a_1z^{-1}+a_2z^{-2}+\ldots$$

can be realized with the filter according to the invention by selecting the number of units and the multiplication factors suitably as needed.

To expand the circuit for processing an additional original data train, it suffices to increase the number of groups by one, to distribute the existing register-adder units cyclically to the groups, and to provide one further data channel, to which the units of the newly created group are connected. Such an expansion will later be described in conjunction with FIGS. 7 through 9, taking three data trains u, v and w as examples.

Figure 2:
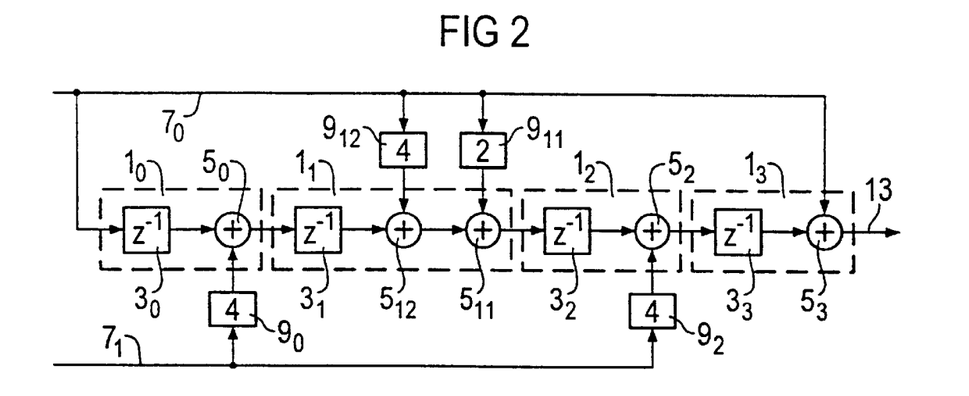
FIG. 2 is a schematic block circuit diagram of a variant of the filter of FIG. 1.

FIG. 2 shows a variant of the circuit of FIG. 1, in which the multipliers have an especially simple structure. In the variant of FIG. 2, the fact is exploited that, in binary representation of numbers, multiplications by a power of two $2^j$ can be achieved very simply by adding j zeros to the right of the number to be multiplied. Therefore, the multiplier $9_0$ can be realized elegantly and simply by connecting all the bits $0, 1, \ldots, v$ of the transmission channel $7_1$ to input bits j, j+1, ..., j+v of an input of the adder $5_0$. The input bits $0, \ldots, j-1$ of the same input of the adder can be fixedly set at the value 0. An especially simple embodiment of the adder is then obtained if it has only inputs for the bits with a number of places of $2^j$ or higher. Because the contents of lower-value lines cannot vary in the addition, they need not be addressed by the adder. Therefore, these low-value lines can be carried directly from the output of the register, belonging to the unit of the adder, to the input of the register of the next unit.

In the case of the multiplier $9_0$, for a multiplication by the factor 4, the output lines of the multiplier are shifted to the left by two bits relative to the input lines.

The multiplier $9_1$ for multiplication by the factor 6 cannot be realized quite so simply. It includes two submultipliers $9_{11}$ and $9_{12}$. The submultiplier $9_{12}$ is constructed exactly like the multiplier $9_0$, and performs a multiplication by 2 by shifting by one bit to the left. Correspondingly, the adder $5_1$ includes two subadders $5_{11}$, $5_{12}$, which add the output values of the submultipliers to the output value of the register $3_1$.

Figure 3:
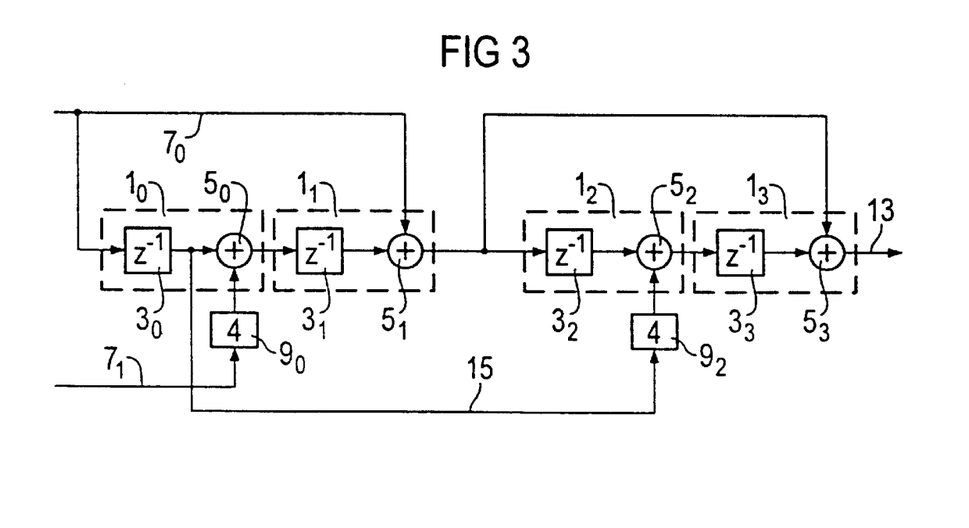
FIG. 3 is a schematic block circuit diagram of a second embodiment of a filter according to the invention that has the same transfer function as the filter of FIGS. 1 and 2 but with a simpler construction.

FIG. 3 shows a further development of the filter of FIGS. 1 and 2, in which the multiplication with factors that are not powers of two is entirely prevented. The embodiment of FIG. 3 is based on the recognition that the second input of the register-adder units need not necessarily be connected to the data channel corresponding to the applicable group; it is also permissible for it to be connected to the output of a unit belonging to the same group, without causing any undesired mixing of the data of the different trains U and V, and that, with the aid of such connections, the circuit structure can be simplified.

Like the filters of FIGS. 1 and 2, the filter shown in FIG. 3 has four series-connected register-adder units $1_0$, $1_1$, $1_2$, $1_3$. The output signal of the register $3_0$ is picked up through a line 15 and carried to the second input of the third unit $1_2$. The output of the unit $1_1$ is connected to the second input of the unit $1_3$. As can easily be seen, the first two units $1_0$, $1_1$ of the circuit, together with the multiplier $9_0$, have the transfer function $H^*_1(z^{-1})=z^{-2}+4z^{-1}+1$. By delay in the register $3_2$ and adding four times the signal $z^{-1}$ transmitted over the line 15, with the aid of the multiplier $9_2$ and the adder $5_2$, the following transfer function is obtained for the output of the unit $1_2$:

$$H^*_2(z^{-1})=(z^{-2}+4z^{-1}+1)z^{-1}+4z^{-1}=z^{-3}+4z^{-2}+5z^{-1}.$$

Another delay in the register $3_3$ and adding of $H^*_1(z^{-1})$ in the adder $5_3$ furnishes the desired transfer function. For such purpose, the circuit of FIG. 3 makes due with minimal expense in that only four registers and four adders are used. And the multipliers, if they are still necessary, have the simplest conceivable structure, because they are needed only for multiplication by powers of two.

Figure 4:
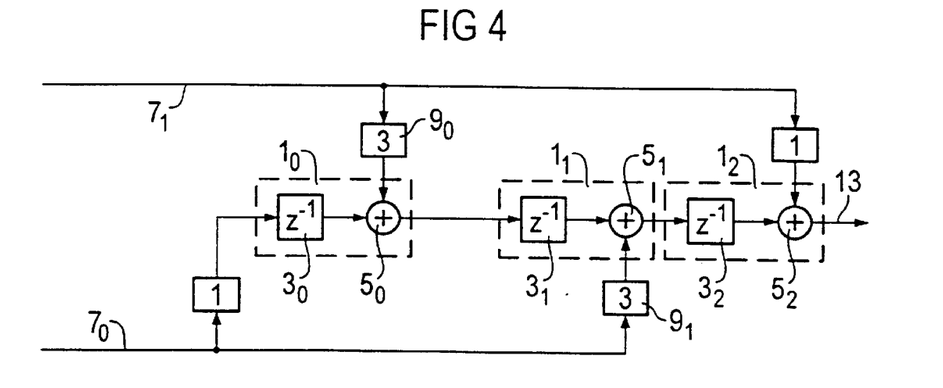
FIG. 4 is a schematic block circuit diagram of a third embodiment of a filter according to the invention.
Figure 5:
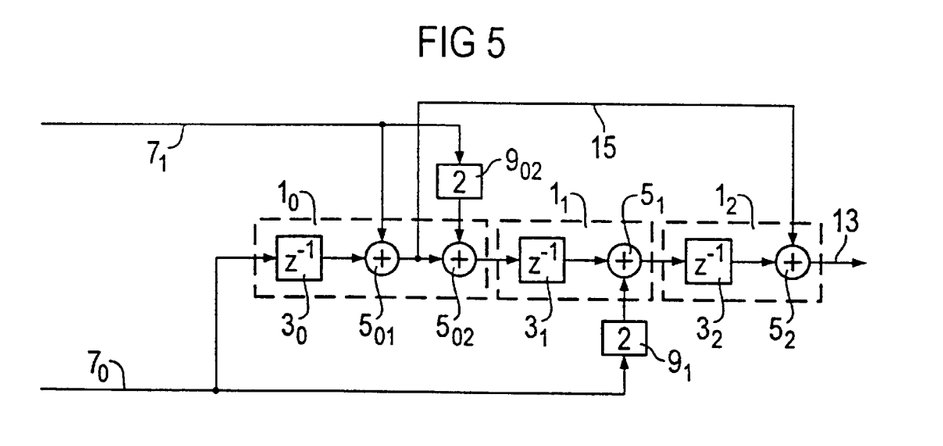
FIG. 5 is a schematic block circuit diagram of a fourth embodiment having the same transfer function as the filter of FIG. 4 but with a simplified structure.

FIGS. 4 and 5 show two filters according to the invention for the transfer function:

$$H(z^{-1})=(z^{-1}+1)^3=1+3z^{-1}+3z^{-2}+z^{-3}.$$

The filter of FIG. 4 is constructed by the same principle as that of FIG. 1. The second inputs of the three register-adder units are each connected through multipliers to one of the data channels $7_0$ or $7_1$; the factors of the multipliers are equal to the corresponding coefficients of the transfer function written as a polynomial.

The multipliers may be constructed from submultipliers using the principle illustrated in FIG. 2.

FIG. 5 again shows a filter with a simplified structure. The multiplier $9_0$ is implemented by a double submultiplier $9_{02}$ and a direct connection to the data channel $7_0$ and by two adders $5_{01}$, $5_{02}$. Through line 15, a signal with the transfer function $H^*_0(z^{-1})=z^{-1}+1$ is picked up and carried to the second input of the unit $1_2$. The modification makes it possible to use, instead of the tripler used in FIG. 4, a doubler $9_{02}$, and, therefore, the filter of FIG. 5 attains the same transfer function with one less adder.

Figure 6:
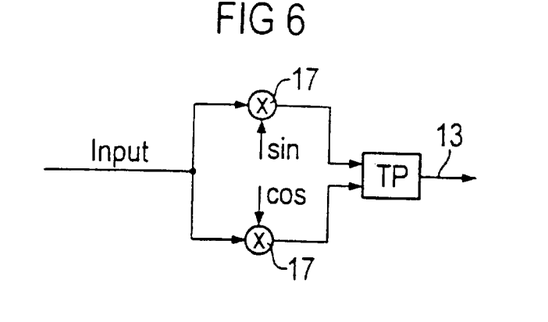
FIG. 6, a schematic block circuit diagram of a filter for generating and filtering quadrature demodulated signals according to the invention.

FIG. 6 shows the basic circuit diagram of a filter with quadrature demodulation of an input train. Typically, in such a filter, data trains modulated with a sine oscillation and a cosine oscillation are generated from an original data train.

In two multipliers 17, the original values are multiplied by sine and cosine values that are read out from a ROM, for example. According to the invention, each of the multipliers 17 multiplies the arriving original data values with a sine value and a cosine value in alternation. As a consequence, values that belong to the sine-modulated (or cosine-modulated) train are applied in alternation to the data channels $7_0$ and $7_1$, respectively, without the need of an upstream multiplexer.

Figure 7:
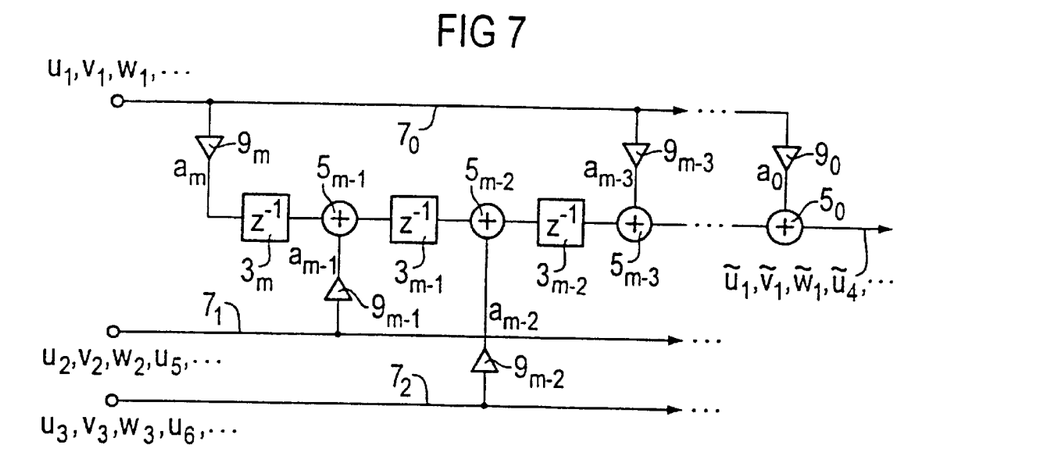
FIG. 7 is a schematic block circuit diagram of a filter according to the invention for joint filtration and decimation of three data trains.

FIG. 7 shows the application of the construction principle according to the invention to a filter for jointly filtering three data trains. In particular, the filter can be used for filtering and decimating digitized RGB or YUV data in television and video technology. The filter of FIG. 7 is preceded by one of the multiplexers shown in FIG. 10, which at three inputs receives the three data trains $u=[u_1, u_2, u_3, u_4, u_5, u_6, \ldots]$, $v=[v_1, v_2, v_3, v_4, v_5, v_6, \ldots]$, and $w_2, w_3, w_4, w_5, w_6, \ldots]$. Each input has two registers 31 that store every arriving train value in memory and delay it by one clock period. A control switch 33 has three groups 34 through 36, each with three inputs. Each group includes one input connected directly with the input of the multiplexer, one singly delayed input, and one doubly delayed input. At the beginning of the conversion, the train values $u_1, v_1, w_1$ are present at the input of the multiplexer, and the registers contain zeros. The control circuit 33 switches the values $u_1$, 0, 0 present at its input 34 through to the output. In the next clock period, values $u_2, v_2, w_2$ are present at the input of the multiplexer. The singly delaying registers contain the values $u_1, v_1, w_1$; the doubly delaying registers contain zeros. The values $u_1$, $v_2$, 0 present at the input 35 are output. In the next clock period, the circuit outputs the values $w_1, v_2, u_3$ present at the input 36. The three channels $7_0, 7_1, 7_2$ of the filter are thus supplied with data trains $u_1, v_1, w_1, u_4, v_4, w_4, \ldots$; 0, $u_2$, $v_2, w_2, u_5, v_5, w_5, \ldots$; and 0, 0, $u_3, v_3, w_3, u_6, v_6, w_6, \ldots$, respectively.

Figure 10:
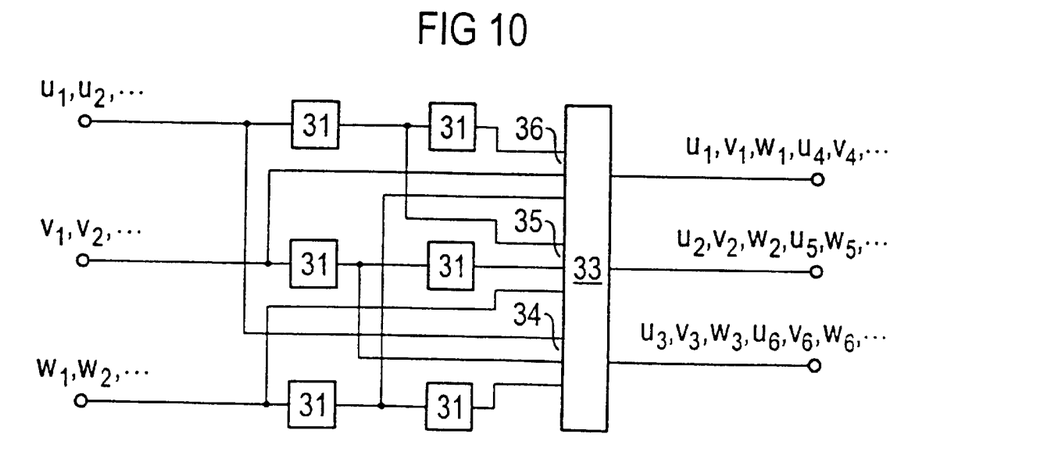
FIG. 10 is a schematic block circuit diagram of a multiplexer for converting data trains into a form that can be processed by the filters of FIG. 7 or FIG. 8.

The construction principle of the multiplexer in FIG. 10 can be used for arbitrary numbers n of data trains to be processed jointly. Each of the n inputs of the multiplexer is assigned a chain of n−1 registers, and the control switch has n groups of n inputs, each one of which is connected to one input of the circuit or to the output of a register that delays i times (i=1, 2, . . . , n−1).

The filter in FIG. 7, like that of FIG. 1, contains a chain that is made up in alternation of adders $5_{m-1}, 5_{m-2}, \ldots, 5_0$ and registers $3_m, \ldots, 3_0$. Each of the three data channels $7_0$, $7_1, 7_2$ of the filter is assigned one group of registers $3_m, \ldots$; $3_{m-1}, \ldots$; and $3_{m-2}, \ldots$, which are connected through multipliers $9_m, 9_{m-1}, \ldots$ and, optionally, adders $5_{m-1}$, $5_{m-2}, \ldots$ to their data channel, in order to achieve a transfer function of the following form;

$$H(z) = a_m z^m + a_{m-1} z^{m-1} + \ldots + a_0.$$

In a first working clock period, over the three data channels, the filter receives the value triplet u1, 0, 0. The registers $3_m, 3_{m-3}, \ldots$ assigned to the channel $7_0$ receive values $a_m u_1, a_{m-3} u_1, \ldots$, etc., while the registers of the other groups remain still unoccupied. In a second clock period, the values $v_1, u_2$, 0 are present in the three channels. The adders $5_{m-1}, 5_{m-4}$ each add values $a_{m-1} u_2, a_{m-4} u_2, \ldots$, to the contents of the registers $3_m, 3_{m-3}, \ldots$ and shift them one place farther in the chain to the registers $3_{m-1}, 5_{m-4}, \ldots$ At the same time, values $a_m v_1, a_{m-3} v_1, \ldots$, etc. are loaded into the registers of the group assigned to the channel $7_0$. In the nest clock period, the values shift one step onward again, and the registers assigned to the channel $7_0$ are loaded with $a_m w_1, a_{m-3} w_1, \ldots$ After m clock periods, the filter begins to output a data of the following form $$a_m u_1 + a_{m-1} u_2 + \ldots + a_0 u_m;$$

$$a_m v_1 + a_{m-1} v_2 + \ldots + a_0 v_m;$$

$$a_m w_1 + a_{m-1} w_2 + \ldots + a_0 w_m;$$

$$a_m u_4 + a_{m-1} u_5 + \ldots + a_0 u_{m+3};$$

The filtering of the trains u, v and w at the same time includes a decimation by the factor 3.

Figure 8:
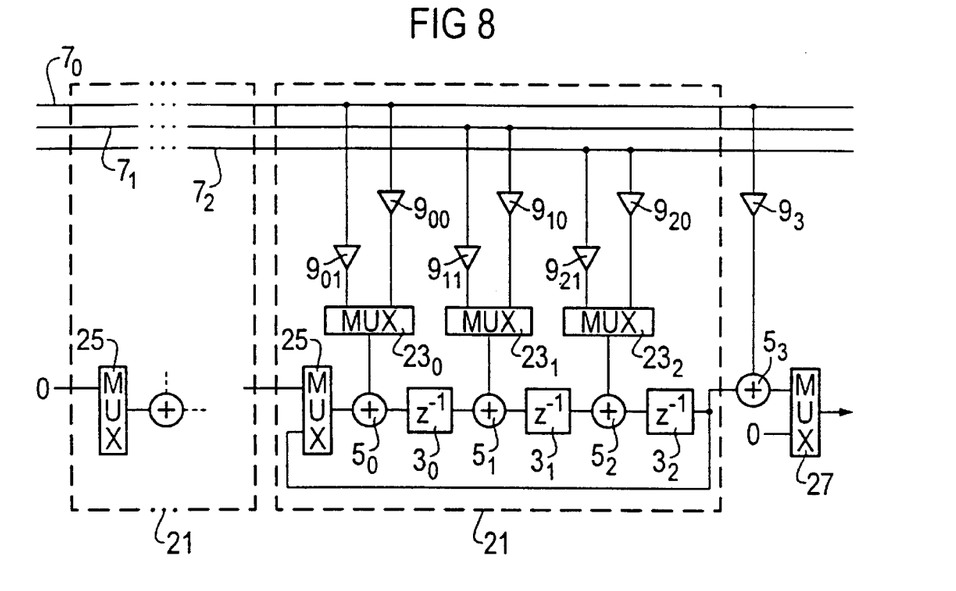
FIG. 8 is a schematic block circuit diagram of a filter for joint filtration of three data trains and decimation of the data trains by the factor 6 according to the invention.

FIG. 8 illustrates the principle of a filter for jointly filtering and decimating by the factor 6. The filter includes 3 data channels $7_0, 7_1, 7_2$ for receiving the data trains output by the multiplexer of FIG. 10. Depending on the stage of the polynomial of the transfer function H(z), the filter has one or more series-connected filter stages 21, each of which includes, depending on the number of data channels, a chain of three adders $5_0, 5_1, 5_2$ and three registers $3_0, 3_1, 3_2$ each and three first multiplexers $23_0, 23_1, 23_2$, and 2 times 3 multipliers $9_{00}, 9_{10}, 9_{20}$ and $9_{01}, 9_{11}, 9_{21}$. Each first multiplexer $23_i$ (i=0, 1, 2) has two inputs that are connected to the data channel $7_i$ through the multipliers $9_{i0}, 9_{i1}$. In an actual implementation of the filter of FIG. 8, depending on the transfer function, individual multipliers and multiplexers can be omitted, as will be explained later.

The input of the first adder $5_0$ of the chain is connected to a second multiplexer 25, of which one input forms the input of the stage 21, and whose second input is connected to the output of the last register $3_2$. The output of the last register $3_2$ is at the same time the output of the filter stage 21. The output of each filter stage 21, except for the last one, leads to the input of a succeeding filter stage. The output of the last one leads to an adder $5_3$, whose second input is connected through a multiplier $9_3$ to the channel $7_0$, and to a multiplexer 27, which outputs the outcome of the filtering and decimation.

The mode of operation of the filter will now be explained in terms of the exemplary embodiment in FIG. 9. The filter is configured for a transfer function:

$$H(z^{-1}) = \Sigma a_j z^{-j} = z^{-5} + 5z^{-4} + 10z^{-3} + 10z^{-2} + 5z^{-1} + 1.$$

The filter has only one filter stage 21. The multiplier $9_3$ corresponding to the coefficient $a_0=1$ has been omitted, as has the multiplier $9_{11}$ corresponding to $a_5=1$. Since $a_6=0$, the corresponding multiplier $9_{01}$ is replaced by a zero signal input. Only one multiplier $9_2$ is provided for the factors $a_4$ and $a_1$ because the factors $a_4$ and $a_1$ are equal, and the multiplexer $23_2$ is omitted.

The filter receives the data trains $v_1, w_1, u_4, v_4, w_4, \ldots$; $u_2, v_2, w_2, u_5, v_5, w_5, \ldots$; and 0, $u_3, v_3, w_3, u_6, v_6, \ldots$ from the multiplexer of FIG. 10. At the beginning of operation, the multiplexers are controlled such that the first multiplexers select their inputs shown on the left in the drawing, and the second multiplexer 25 selects the upper input, where 0 is always present. Of the first value triplet $v_1, u_2$, 0 appearing on the channels, the value $v_1$ is lost; the registers $3_0, 3_1, 3_2$ receive the contents 0, $5u_2$, 0. The next clock period with the value triplet $w_1, v_2, u_3$ leads to register contents of 0, $5v_2$, $5u_2 + 10u_3$. For the next clock period, the multiplexers $23_0$ and 25 are switched over, so that the values output by the register $3_2$ are returned to the adder 50, and the right-hand input of the first multiplexer $23_0$ is active. Thus, the value triplet $u_4, w_2, v_3$ produces the register occupation $5u_2 + 10u_3 +$ $10u_4$, $5v_2 + 10v_3$, $5w_2$. With the next clock period, the multiplexer $23_1$, if it were present, would have to be switched over, and the multiplexer $23_2$ after it. One further clock period later, the multiplexer 27 selects its upper input, and for three clock periods it outputs the filter results for the trains u, v, w. In continuous operation of the filter, all the multiplexers change their state after each three clock periods. For every six train values input, one filtered value is thus obtained, that is, a decimation factor of 6.

Higher decimation factors, which are always an integral multiple of the number of channels, can be obtained in a simple way if the number of inputs of the first multiplexers and the number of times that the input data circulate in the filter stage are raised.

Figure 9:
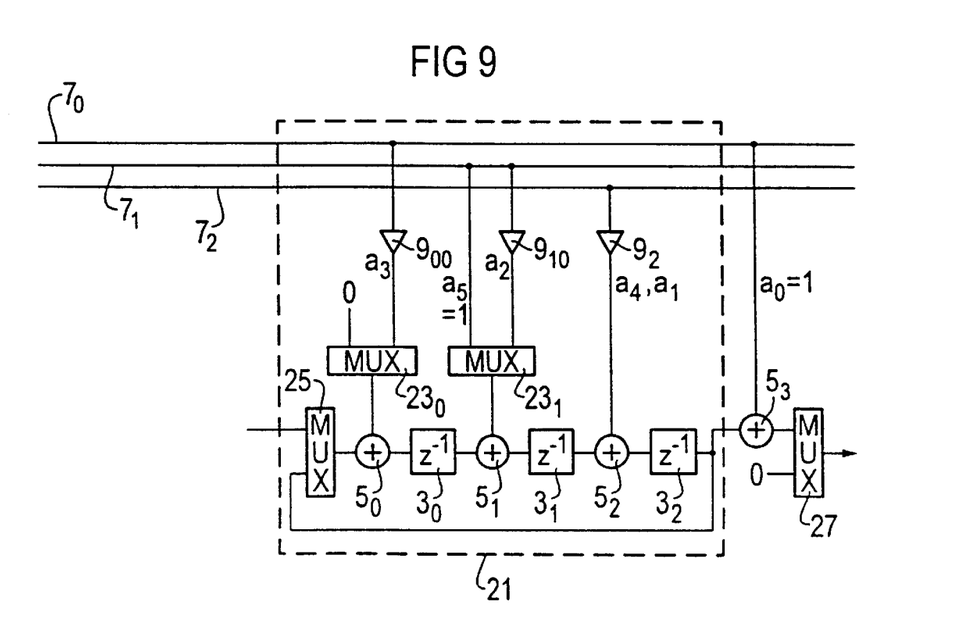
FIG. 9 is a schematic block circuit diagram of an exemplary embodiment of the filter of FIG. 8.

The same effect as with the filters of FIGS. 7 through 9 can be attained if the second multiplexers 25 on the input side are replaced by demultiplexers at the output of the last register $5_2$.

The multipliers of the filters of FIGS. 7 through 9 can also be constructed from submultipliers, as described in conjunction with FIG. 2. In the case of the filter of FIG. 8 or FIG. 9, multipliers connected to the same multiplexer can in particular have submultipliers in common.

We claim:

1. A filter for filtering n data trains by time division multiplexing, in which n is an integer>2, comprising:

data channels for receiving values of the n data trains;

registers for buffer storage of at least one of the values of the n data trains and derived values derived from the n data trains, said registers subdivided into n groups, each of said n groups of said registers connected to at least one of said data channels for receiving the values of the n data trains;

adders each having a first input and a second input, said adders and said registers alternatively connected to one another to form a chain, said first input of each respective adder connected upstream of a respective one of said registers of an $i^{th}$ group ($0 \leq i \leq n-1$) of said n groups has a connection to a respective one of said data channels assigned to said $i^{th}$ group of said n groups, and said second input of a corresponding respective adder connected to a respective one of said registers of a group having a number (i−1)mod n without an intervening register of another of said groups; and a multiplexer having n inputs for each of the n data trains and n outputs, each of said n outputs respectively connected to one of said data channels, said multiplexer outputting data values of one of the n data trains in cyclic alternation to said data channels.

2. The filter according to claim 1, including a multiplier disposed between each of said n groups and at least one of said data channels.

3. The filter according to claim 1, including:

parallel multipliers for multiplication by various factors, said parallel multipliers disposed between each of said n groups and at least one of said data channels; and a switch for selectively connecting one of said multipliers with a respective one of said adders.

4. The filter according to claim 1, including:

at least one multiplier for multiplication by a factor k not a power of two, said at least one multiplier disposed between each of said n groups and at least one of said data channels and having parallel submultipliers for multiplying by a power of two ($2^j$), said parallel submultipliers having input data lines and output lines, said parallel submultipliers having a connection of said input data lines to said output lines each left-shifted by j bits; and further adders connected to said parallel submultipliers adding output values of said parallel submultipliers.

5. The filter according to claim 1, wherein said chain has m adders of said adders with an output and m registers of said registers with an input, an input of a $0^{th}$ register of said registers is connected to a respective data channel, and an input of a $j^{th}$ register is connected to an output of a $(j-1)^{th}$ adder for all j>0, said chain realizing a transfer function $(H(z^{-1}) = \Sigma a_j z^{-j})$ represented as a polynomial in $z^{-1}$ where j=0, 1, . . . , m−1.

6. The filter according to claim 5, including a multiplier, said m adders having an input, and said input of a $j^{th}$ adder of said m adders being connected to a respective data channel through said multiplier for multiplication by the factor $a_j$ for all $a_j \neq 1$.

7. The filter according to claim 1, wherein at least one of said n groups has two registers of said registers each with an output, and at least one adder of said adders has two inputs respectively connected to said output of said two registers.

8. The filter according to claim 1, including a demultiplexer having outputs, each of said outputs forming one output connected to a respective one of said n data trains of the filter, one of said adders having an output, and said demultiplexer connected to said output of said one of said adders.

9. A filter configuration, comprising:

a filter for filtering more than two data trains by time division multiplexing having:

data channels for receiving values of the data trains;

registers for buffer storage of at least one of the values of the data trains and derived values derived from the data trains, said registers subdivided into n groups, each of said n groups of said registers connected to at least one of said data channels for receiving the values of the data trains;

adders each having a first input and a second input, said adders and said registers alternatively connected to one another to form a chain, said first input of each respective adder connected upstream of a respective one of said registers of an $i^{th}$ group ($0 \leq i \leq n-1$) of said n groups has a connection to a respective one of said data channels assigned to said $i^{th}$ group of said n groups, and said second input of a corresponding respective adder connected to a respective one of said registers of a group having the number (i−1)mod n without an intervening register of another of said groups; and a multiplexer having n inputs for each of the n data trains and n outputs, each of said n outputs respectively connected to one of said data channels, said multiplexer outputting data values of one of the n data trains in cyclic alternation to said data channels.

10. A method for operating a filter for filtering n data trains by time division multiplexing, in which n is an integer>2, which comprises:

receiving values of the n data trains through data channels;

buffer storing at least one of values of the n data trains and derived values derived from the n data trains with registers and subdividing the registers into n groups;

alternatively connecting adders and the registers to one another to form a chain, each of the adders having first and second inputs;

connecting each of the n groups to at least one of the data channels;

connecting a respective adder upstream of a respective one of the registers of an $i^{th}$ group ($0 \leq i \leq n-1$) of the groups, and connecting the first input of each respective adder to a respective one of the data channels assigned to the $i^{th}$ group of the n groups;

connecting the second input of a corresponding respective adder to a respective one of the registers of a group having a number (i−1)mod n without an intervening register of another of the n groups;

connecting n inputs of a multiplexer to each of the n data trains, respectively connecting each of n outputs of the multiplexer to one of the data channels, and outputting data values of one of the n data trains in cyclic alternation to said data channels with the multiplexer;

applying a value of the $i^{th}$ data train to the data channel of the group (i+d)mod n for all i=0, . . . , n−1;

storing in each respective register the values present at the first inputs of each respective register;

varying d in the applying step by 1; and repeating, at least once, the applying step, the storing step, and the varying step.

11. The method according to claim 10, wherein the n data trains each have a clock rate, and setting clock rates of all of the n data trains to be the same.

12. The method according to claim 11, wherein the n data trains each have a clock period, and performing the applying step, the storing step, the varying step, and the repeating step n times during each clock period of the n data trains.

13. The method according to claim 11, wherein the n data trains each have a clock period, and performing the applying step, the storing step, the varying step, and the repeating step once during each clock period of the n data trains.

14. A method for operating a filter for filtering n data trains by time division multiplexing, in which n is an integer>2, which comprises:

providing a filter having:

data channels for receiving values of the n data trains;

registers for buffer storage of at least one of the values of the n data trains and derived values derived from the n data trains, the registers subdivided into n groups, each of the n groups connected to at least one of the data channels for receiving values of the n data trains; and adders each having first and second inputs, the adders and the registers alternatively connected to one another to form a chain, the first input of each respective adder connected upstream of a respective one of the registers of an $i^{th}$ group ($0 \leq i \leq n-1$) of the n groups has a connection to a respective one of the data channels assigned to the $i^{th}$ group of the n groups, and the second input of a corresponding respective adder connected to a respective one of the registers of a group having the number (i−1)mod n without an intervening register of another of the n groups; and a multiplexer having n inputs for each of the n data trains and n outputs, each of said n outputs respectively connected to one of said data channels, said multiplexer outputting data values of one of the n data trains in cyclic alternation to said data channels; and parallelly decimating the n data trains by a common factor using the filter.

\* \* \* \* \*